United States Patent
Goyal et al.

(10) Patent No.: US 8,343,864 B2
(45) Date of Patent: Jan. 1, 2013

(54) DRAM WITH SCHOTTKY BARRIER FET AND MIM TRENCH CAPACITOR

(75) Inventors: Puneet Goyal, Bangalore (IN); Herbert Lei Ho, Hopewell Junction, NY (US); Pradeep Jana, Bangalore (IN); Jin Liu, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/073,103

(22) Filed: Mar. 28, 2011

(65) Prior Publication Data

US 2012/0248522 A1    Oct. 4, 2012

(51) Int. Cl.
*H01L 29/28* (2006.01)
*H01L 29/40* (2006.01)
*H01L 29/47* (2006.01)

(52) U.S. Cl. .. 438/583; 257/471; 257/485; 257/E29.346

(58) Field of Classification Search ............. 257/296, 257/301, E29.346, 454, 471, 485; 438/243, 438/246, 387, 570, 581, 583
See application file for complete search history.

(56) References Cited

U.S. PATENT DOCUMENTS

| | | | |
|---|---|---|---|
| 7,564,086 B2 | 7/2009 | Kwon et al. | |
| 2006/0160298 A1* | 7/2006 | Kwon et al. | 438/243 |
| 2006/0257563 A1* | 11/2006 | Doh et al. | 427/248.1 |
| 2007/0057302 A1* | 3/2007 | Ho et al. | 257/301 |
| 2009/0079030 A1* | 3/2009 | Cheng et al. | 257/532 |
| 2009/0108314 A1 | 4/2009 | Cai et al. | |
| 2009/0159948 A1 | 6/2009 | Ho et al. | |
| 2009/0174031 A1 | 7/2009 | Wang et al. | |
| 2009/0236691 A1 | 9/2009 | Dyer et al. | |
| 2009/0268510 A1 | 10/2009 | Barth, Jr. et al. | |

OTHER PUBLICATIONS

H.-S.P. Wong; Beyond the Conventional Transistor; IBM J. Res. & Dev., vol. 46, No. 2/3, Mar./May 2002; pp. 133-153.
Eric Gerritsen, et al.; Evolution of Materials Technology for Stacked-Capacitors in 65nm Embedded-DRAM; Solid-State Electronics, 49, 2005; pp. 1767-1775.
Pankaj Kilra; Advanced Source/Drain Technologies for Nanoscale CMOS; Dissertation, University of California, Berkeley; Fall 2008; pp. 1-175.
E. Dubois; Final Report and Periodic Project Report; Information Society Technologies (1st) Programme; SODAMOS Project IST-2000-26475; pp. 1-275.

* cited by examiner

*Primary Examiner* — Matthew Reames
*Assistant Examiner* — Nikolay Yushin
(74) *Attorney, Agent, or Firm* — Joseph P. Abate; Howard M. Cohn

(57) ABSTRACT

A semiconductor circuit and method of fabrication is disclosed. In one embodiment, the semiconductor circuit comprises a metal-insulator-metal trench capacitor in a silicon substrate. A field effect transistor is disposed on the silicon substrate adjacent to the metal-insulator-metal trench capacitor, and a silicide region is disposed between the field effect transistor and the metal-insulator-metal trench capacitor. Electrical connectivity between the transistor and capacitor is achieved without the need for a buried strap.

20 Claims, 10 Drawing Sheets

DRAM WITH SCHOTTKY BARRIER FET AND MIM TRENCH CAPACITOR

FIELD OF THE INVENTION

The present invention relates generally to semiconductor fabrication, and more particularly, to fabrication of dynamic random access memory (DRAM).

BACKGROUND OF THE INVENTION

A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically oriented capacitors within each deep trench. Thus, the surface area required for the storage capacitor is dramatically reduced without sacrificing capacitance, and correspondingly, storable charge.

Trench-type memory devices are advantageous, in comparison to planar memory configurations, for increased density, performance and lithographic considerations. Trench-type memory devices increase density by reducing the cell area of each memory device, therefore allowing for closer positioning of adjacent memory devices.

As the trend towards miniaturization increases, as does the performance demands of electronic devices, it is desirable to have and improved DRAM and method of fabrication.

SUMMARY

In one embodiment of the present invention, a method of fabricating a semiconductor circuit is disclosed. The method comprising forming a metal-insulator-metal trench capacitor in a silicon substrate, forming a field effect transistor on the silicon substrate adjacent to the metal-insulator-metal trench capacitor, and forming a silicide region between the field effect transistor and the metal-insulator-metal trench capacitor.

In another embodiment of the present invention, a method of forming a semiconductor circuit is provided. The method comprising depositing a buried oxide layer on a silicon substrate, depositing a silicon-on-insulator layer on the buried oxide layer, depositing a SiON layer on the silicon-on-insulator layer, depositing a high density plasma oxide layer on the silicon-on-insulator layer; forming a trench in the silicon substrate, depositing a first metal in the trench, depositing a dielectric layer within the trench, depositing a second metal within the trench, planarizing the second metal to the level of the SiON layer; and removing a portion of the second metal, whereby the second metal is recessed to a level below the top of the silicon-on-insulator layer.

In another embodiment of the present invention, a semiconductor circuit is provided. The circuit comprising a silicon substrate, a metal-insulator-metal trench capacitor formed in the silicon substrate, the metal-insulator-metal trench capacitor comprising a first electrode, a second electrode, and a dielectric layer disposed in between the first electrode and second electrode, a field effect transistor disposed on the silicon substrate adjacent to the metal-insulator-metal trench capacitor; and a silicided region disposed on the silicon substrate such that it electrically connects the metal-insulator-metal trench capacitor to the field effect transistor.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs.) of the drawing, in which case typically the last two significant digits may be the same, the most significant digit being the number of the drawing figure (FIG).

FIG. 1 shows a starting point for a process in accordance with an embodiment of the present invention.

FIG. 2 shows an intermediate step, where metal is deposited.

FIG. 3 shows an intermediate step, where metal is removed from the top portion of the structure.

FIG. 4 shows an intermediate step, where a high-K dielectric is applied.

FIG. 5A shows an intermediate step, where the trench is filled with a resist.

FIG. 5B shows an intermediate step, where the high-K dielectric is etched back.

FIG. 6 shows an intermediate step, where a resist layer is removed.

FIG. 7 shows an intermediate step, where a metal fill is deposited in the trench.

FIG. 8 shows an intermediate step, where the structure is planarized.

FIG. 9 shows an intermediate step, where the metal fill is etched.

FIG. 10 shows an intermediate step, where a trench-top oxide is applied.

Figure 11:
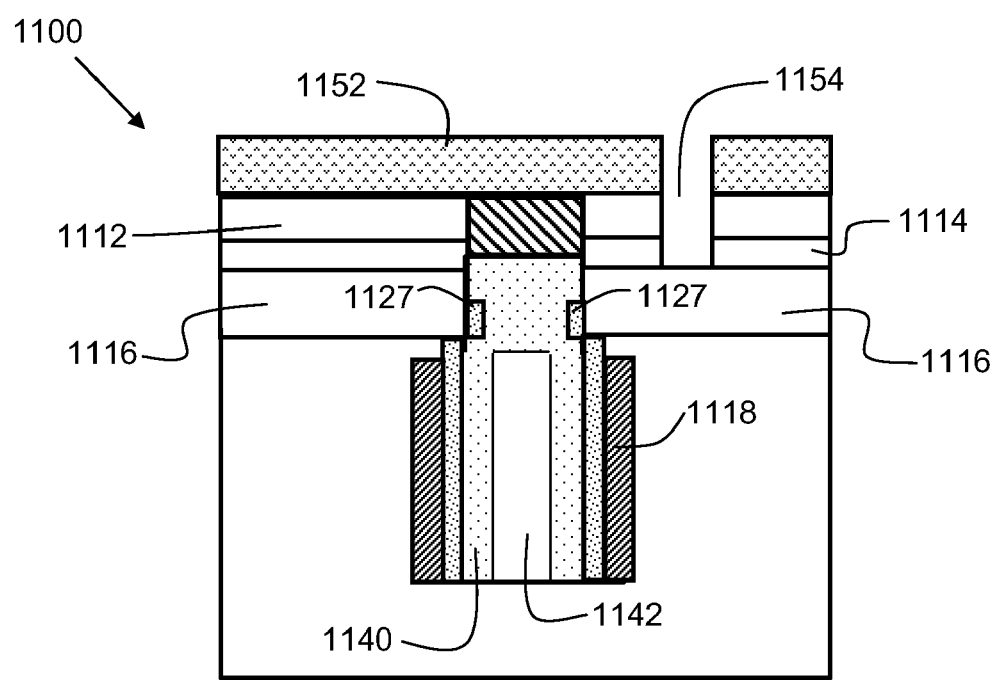

FIG. 11 shows an intermediate step, where an STI cavity is formed.

Figure 12:
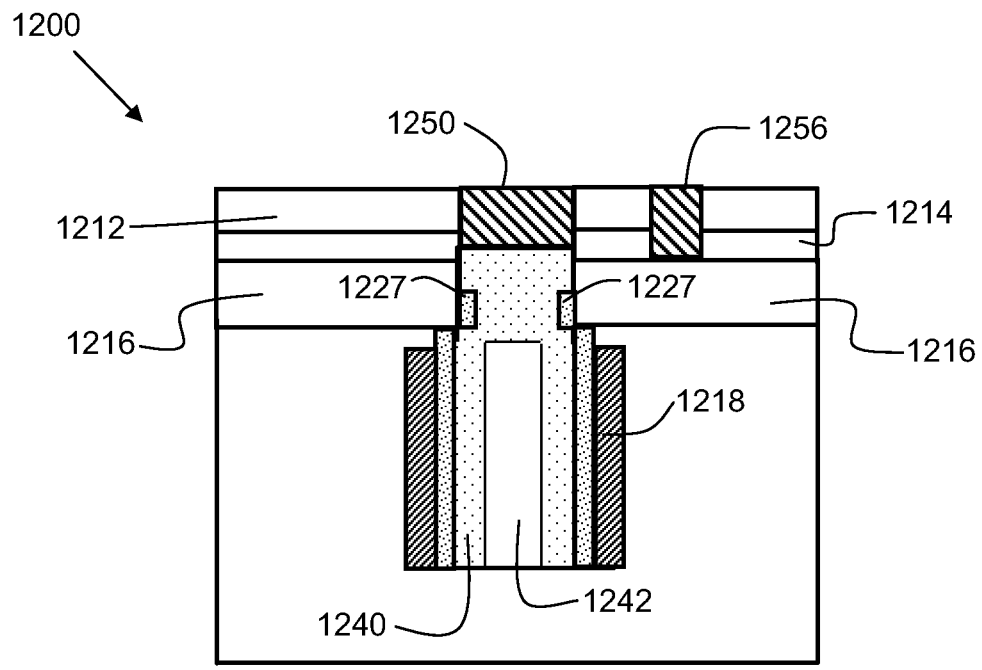

FIG. 12 shows an intermediate step, where the STI cavity is filled.

Figure 13:
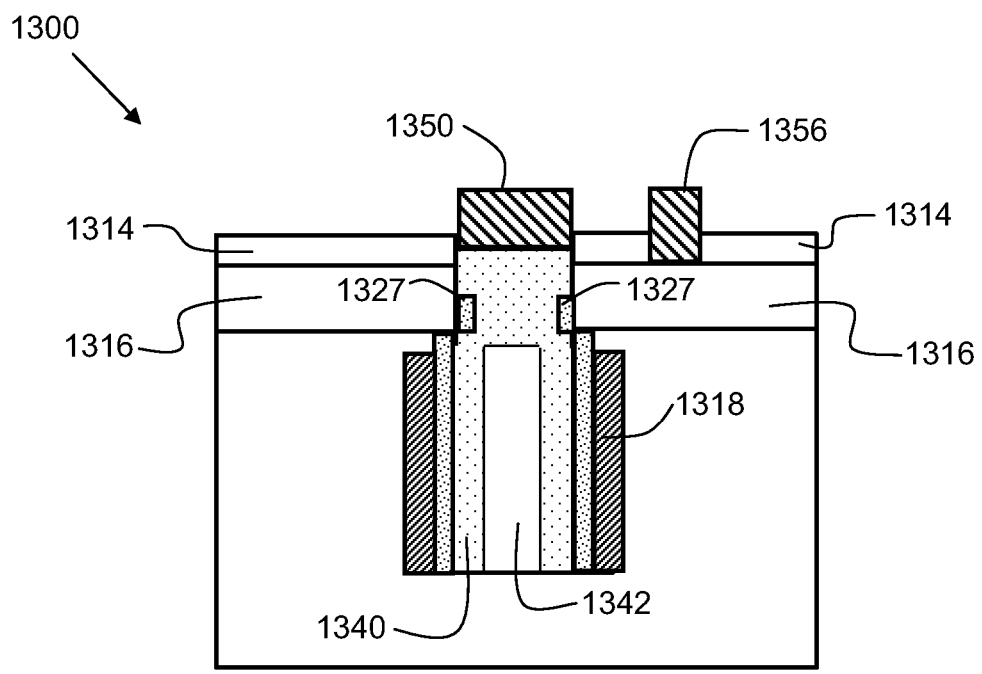

FIG. 13 shows an intermediate step, where the SiON layer is removed.

Figure 14:
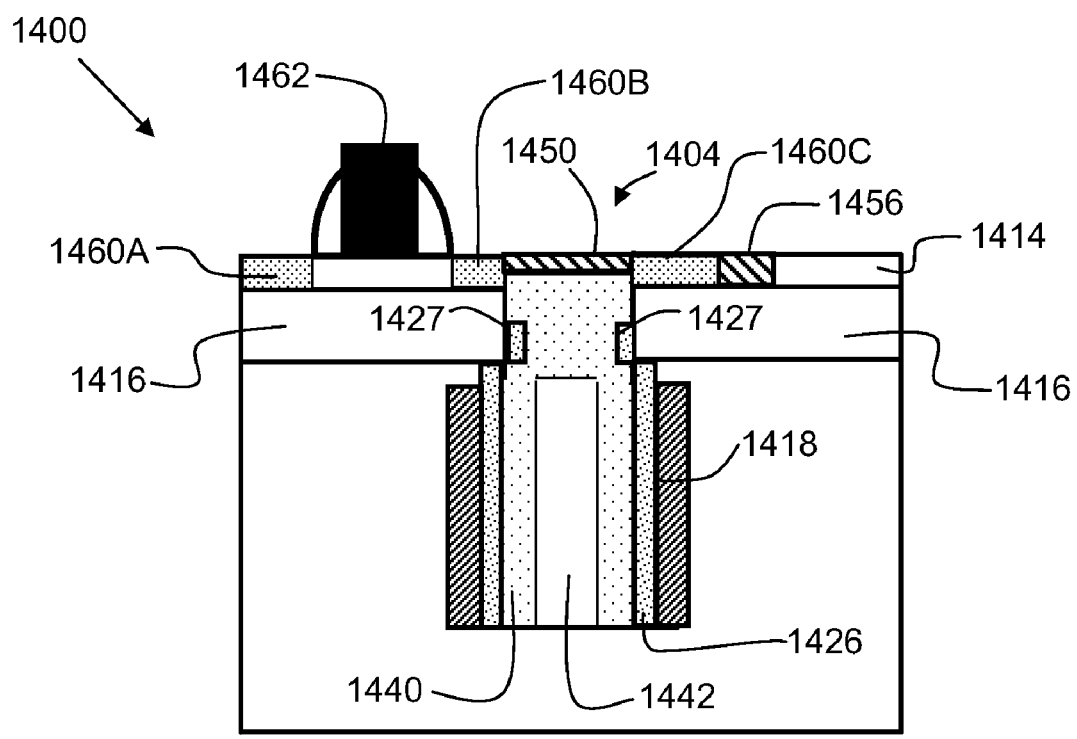

FIG. 14 shows a structure in accordance with an embodiment of the present invention.

Figure 15:
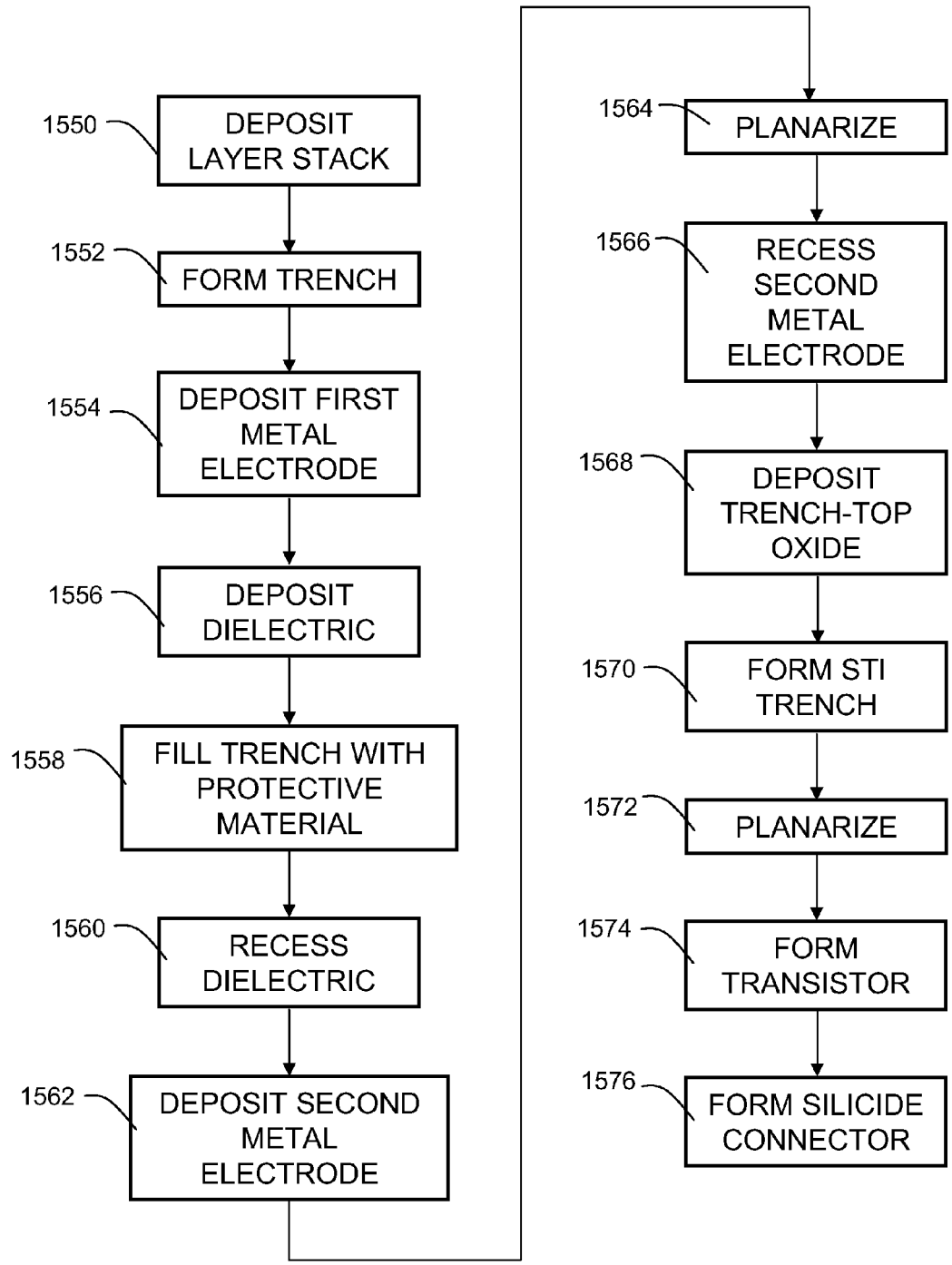

FIG. 15 is a flowchart indicating process steps for an embodiment of the present invention.

Figure 16:
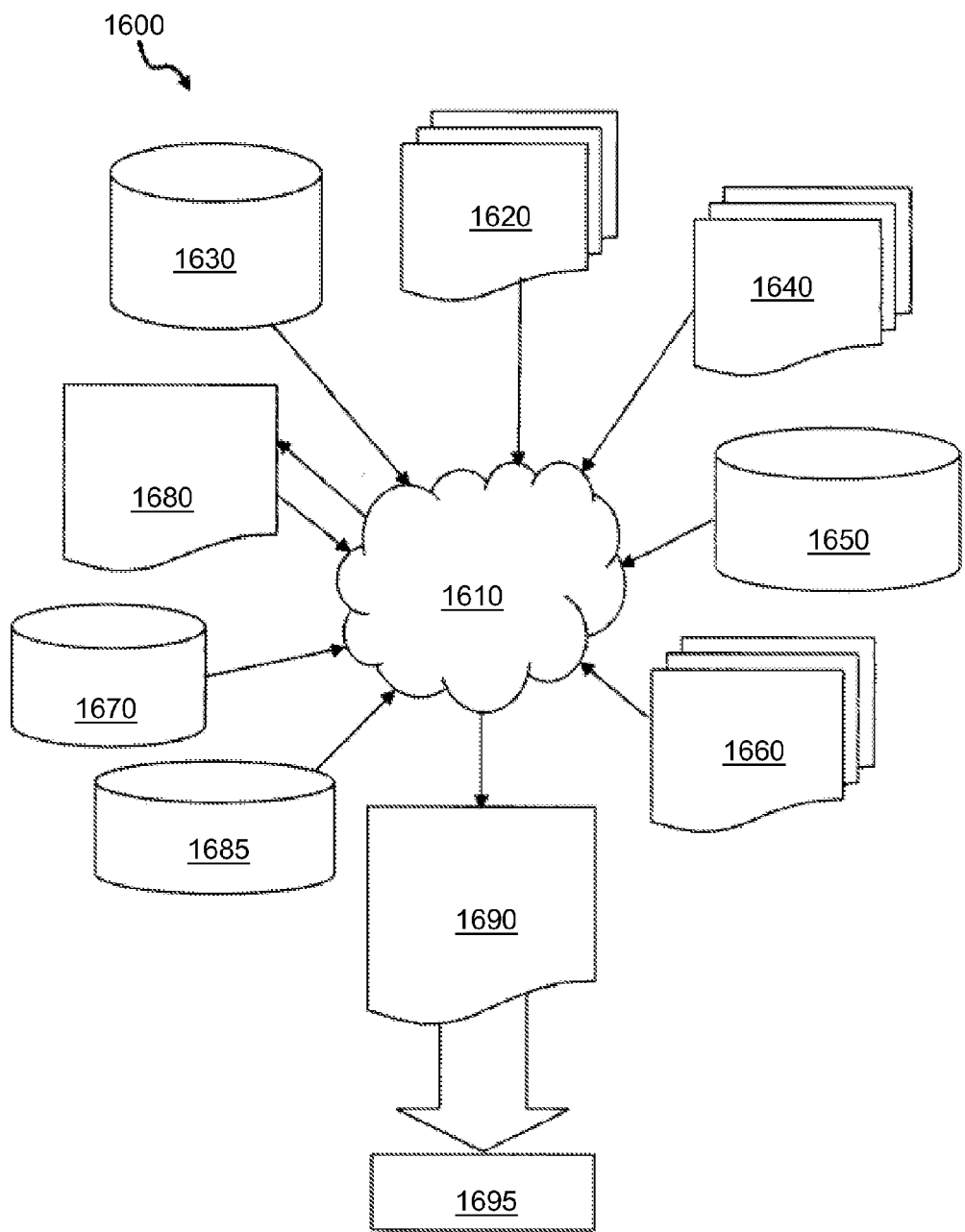

FIG. 16 shows a block diagram of an exemplary design flow.

DETAILED DESCRIPTION

Figure 1:
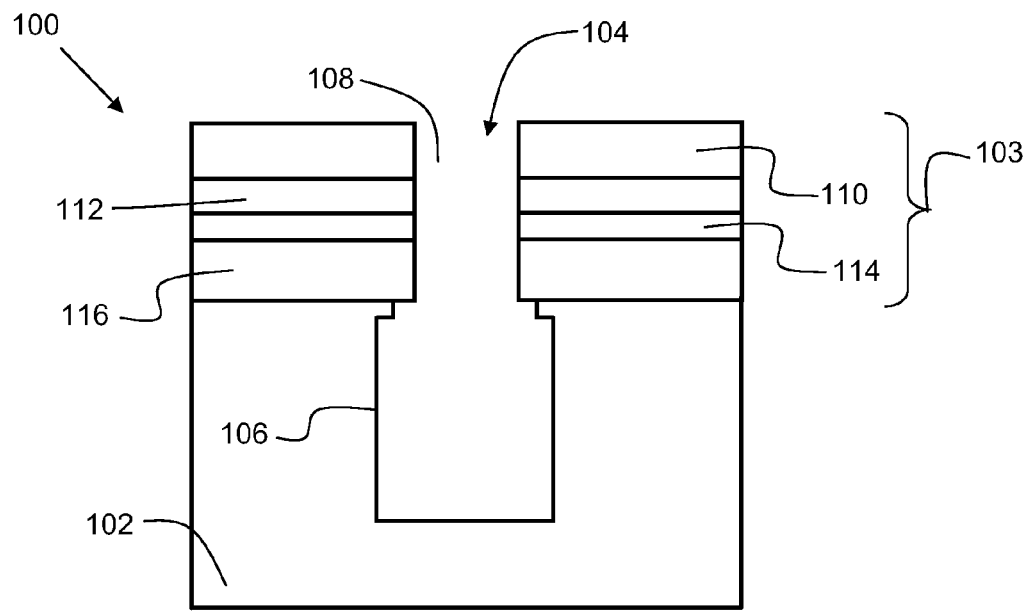

FIG. 1 shows a structure 100, which is a starting point for a process in accordance with an embodiment of the present invention. Silicon substrate 102 has a layer stack 103 disposed on top of substrate 102. The layer stack 103 comprises buried oxide (BOX) layer 116, Silicon-on-Insulator (SOI) layer 114, SiON layer 112, and high density plasma oxide (HDP) layer 110. A trench 104 formed within the layer stack 103 and the substrate 102. The trench 104 is comprised of upper portion 108 and lower portion 106. Upper portion 108 is within layer stack 103, and lower portion 106 is within substrate 102. Hence, the trench 104 traverses the layer stack 103 and extends into substrate 102. The trench 104 may be formed via a reactive-ion-etch (RIE), or other suitable technique. The lower portion 106 may be wider than the upper portion 108.

In one embodiment, the BOX layer 116 has a thickness in the range of 1000 angstroms to 1800 angstroms, the SOI layer 114 may have a thickness in the range of 500 angstroms to 1200 angstroms, the SiON layer 112 may have a thickness in the range of 1000 angstroms to 1400 angstroms, and the HDP layer 110 may have a thickness in the range of 2600 angstroms to 3400 angstroms.

Figure 2:
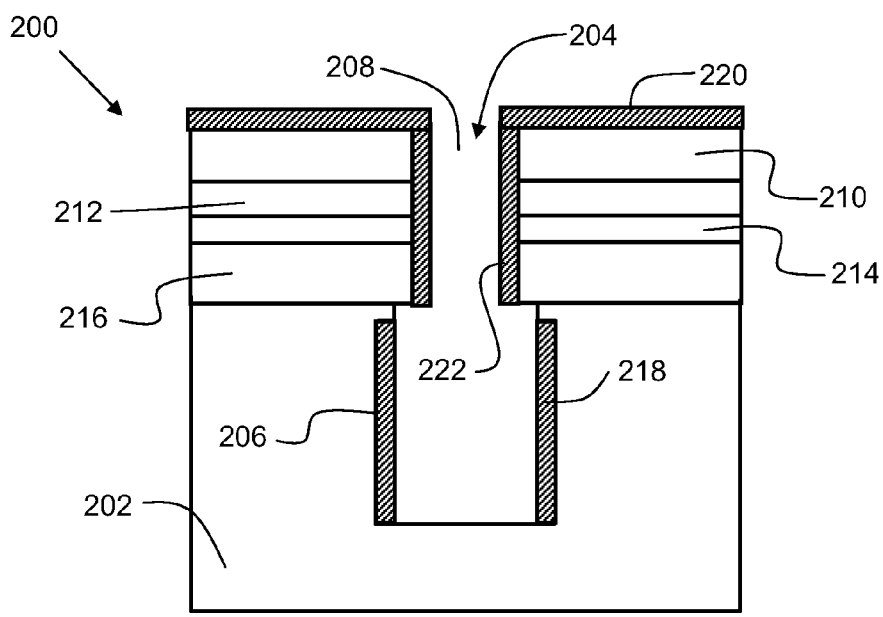

FIG. 2 shows a structure 200 after an intermediate step, where a transition metal is deposited. In one embodiment, the metal is comprised of tungsten, cobalt, or nickel. It may be deposited via atomic layer deposition (ALD). Metal region 218 is formed within the lower trench portion 206, and serves as the bottom electrode of the completed MIM trench capacitor. Note, as mentioned previously, like elements in subsequent figures may share common ending numbers. For example, lower portion 206 of FIG. 2 is similar to lower portion 106 of FIG. 1. Metal region 222 is formed within the upper portion 208, and metal region 220 is formed on the top of the structure, above HDP layer 210. A silicidation step is then performed to silicide the lower portion of the trench. The silicidation process may comprise heating the structure 200, to allow metal region 222 to react with the adjacent silicon of substrate 202.

Figure 3:
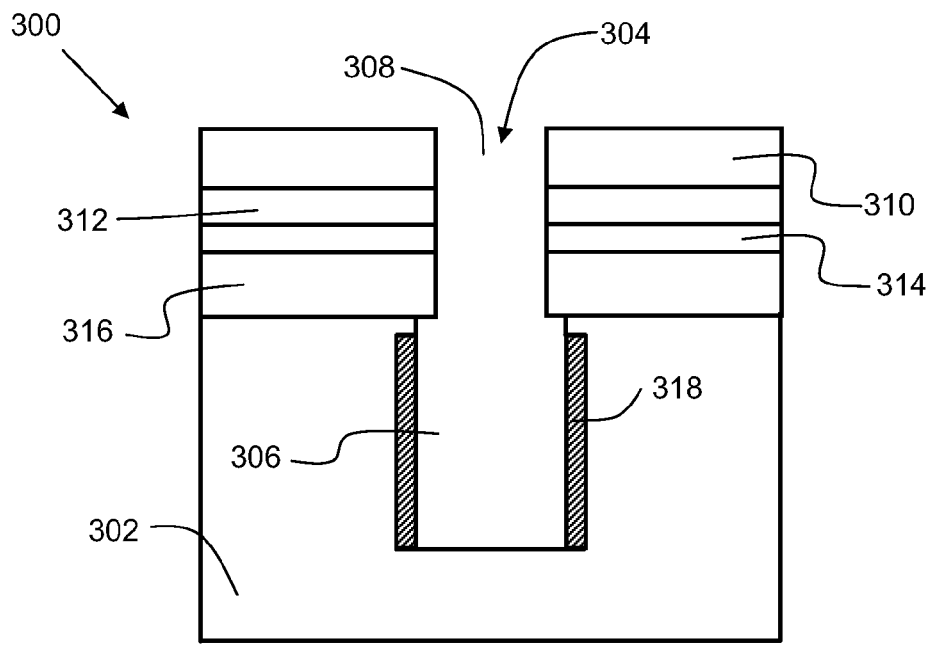

FIG. 3 shows a structure 300 after a subsequent intermediate step, where the transition metal is removed from the top portion of the structure. The metal is removed from the HDP layer 300, and the upper portion 308 of trench 304 (compare with FIG. 2, see regions 220 and 222). The metal may be removed with an etch comprising an SC1 or SC2 chemistry (NH4OH:H2O2::H2O) or an aqua-regia chemistry (H2O2:HNO3:HCl).

Figure 4:
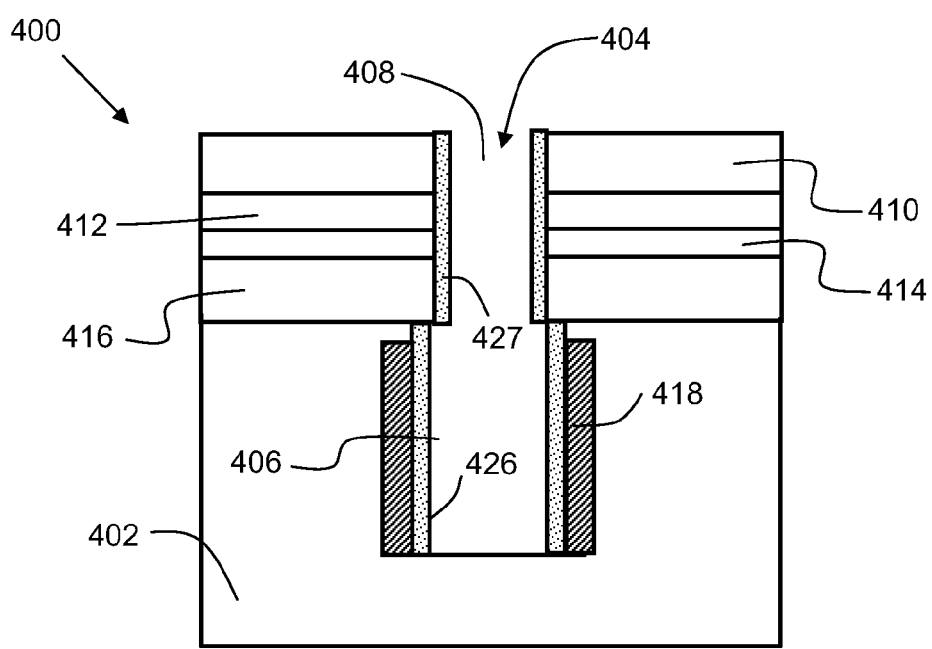

FIG. 4 shows a structure 400 after a subsequent intermediate step, where a high-K dielectric is applied. The high-K dielectric may be applied via atomic layer deposition. The high-K dielectric may be comprised of hafnium oxide. In another embodiment, the high-K dielectric may be comprised of silicon doped hafnium oxide (HfSiOx). Two regions of high-K dielectric are formed. Region 426 is in the lower portion 406 of trench 404. Region 427 is in the upper portion 408 of trench 404.

Figure 5A:
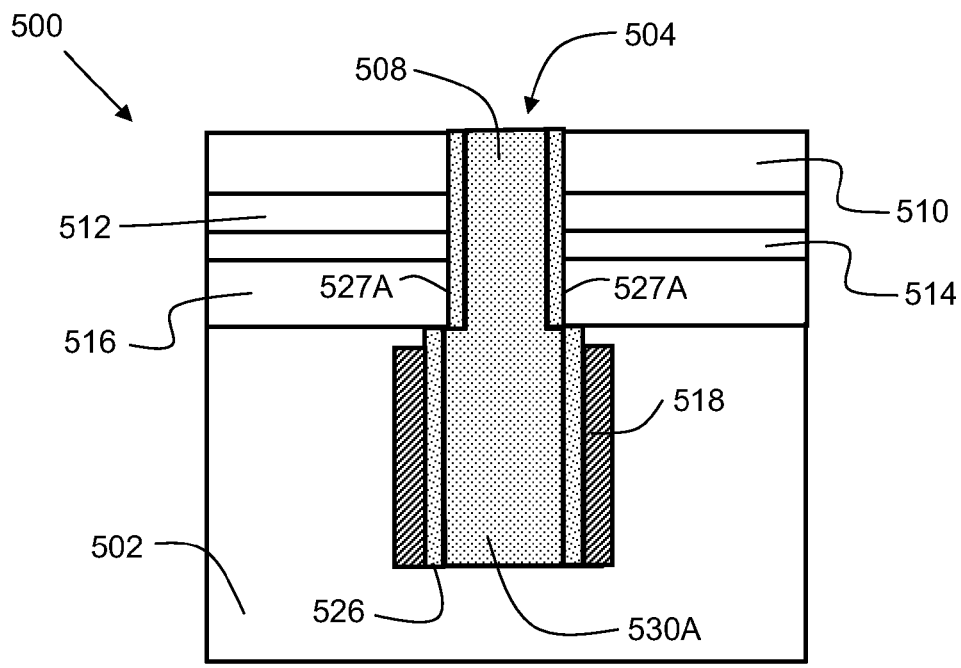

FIG. 5A shows a structure 500 after an intermediate step, where the trench 504 is filled with resist 530A. This serves to protect the trench interior during a subsequent etch. Alternatively, in place of resist, amorphous carbon may be used to fill the trench 504.

Figure 5B:
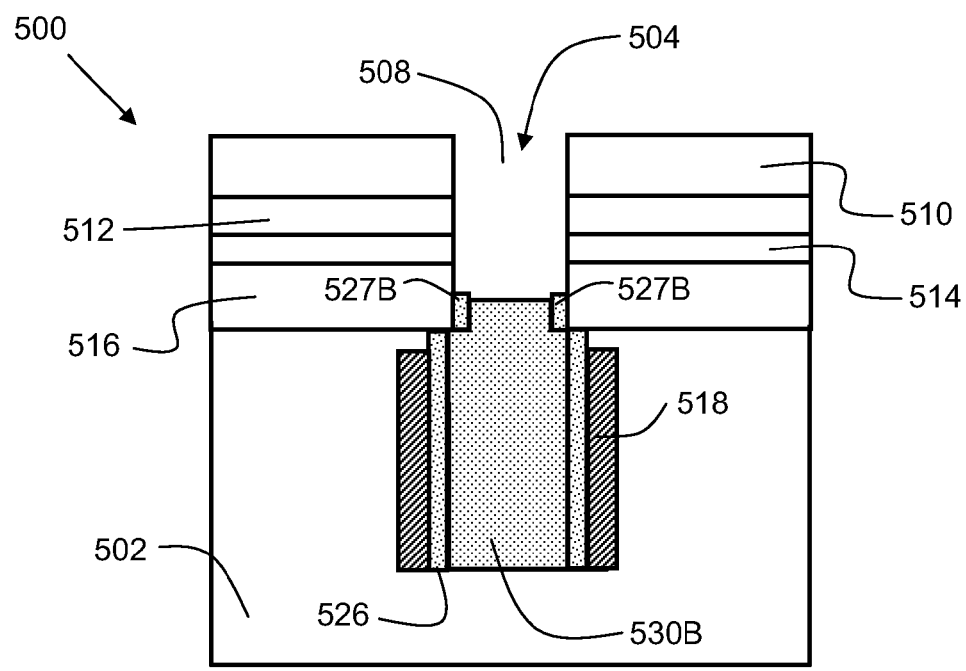

FIG. 5B shows structure 500 after an intermediate step, where the high-K dielectric 527B and resist 530B are etched back (compare with 527A of FIG. 5A) to about one half the depth of BOX layer 516. The etch to remove a portion of the resist 530B (compare with 530A of FIG. 5A) and dielectric layer may be performed with a reactive ion etch. In one embodiment, the RIE used is an oxygen-based RIE, sometimes referred to as an oxygen ashing technique.

Figure 6:
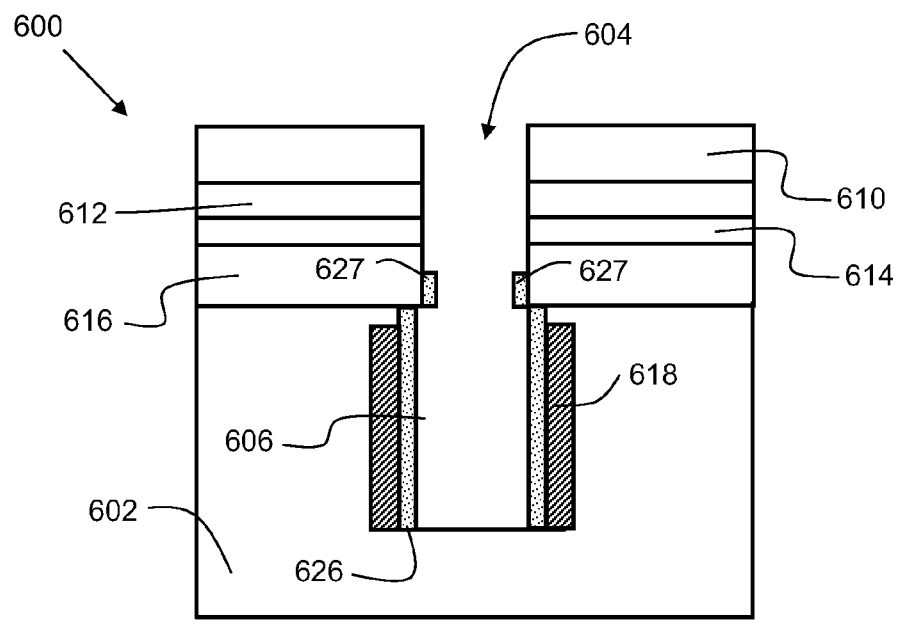

FIG. 6 shows a structure 600 after an intermediate step, where the resist layer is removed. This is preferably performed with a selective wet etch that allows dielectric layer 626 to remain in the lower portion of trench 604.

Figure 7:
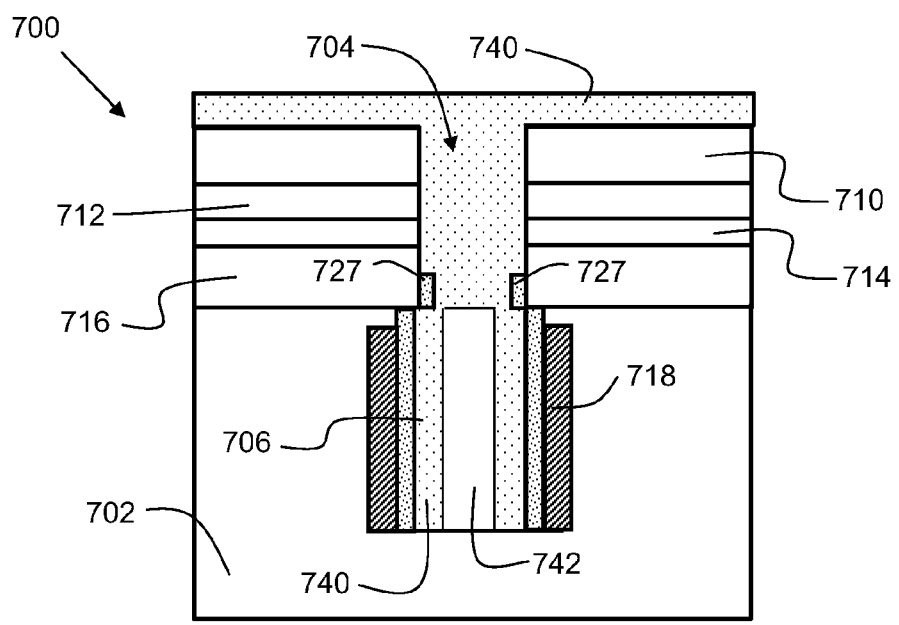

FIG. 7 shows a structure 700 after an intermediate step, where a metal 740 is deposited in the trench. Metal 740 serves as the top electrode of the MIM capacitor, once the fabrication process is completed. The metal 740 may not completely fill the lower portion 706 of trench 704, and a void 742 may form within the interior of the lower portion 706 of the trench 704, while the metal 740 is in contact with the sides of the lower portion 706 of trench 704. In one embodiment, metal 740 is comprised of tungsten. In another embodiment, metal 740 is comprised of titanium.

Figure 8:
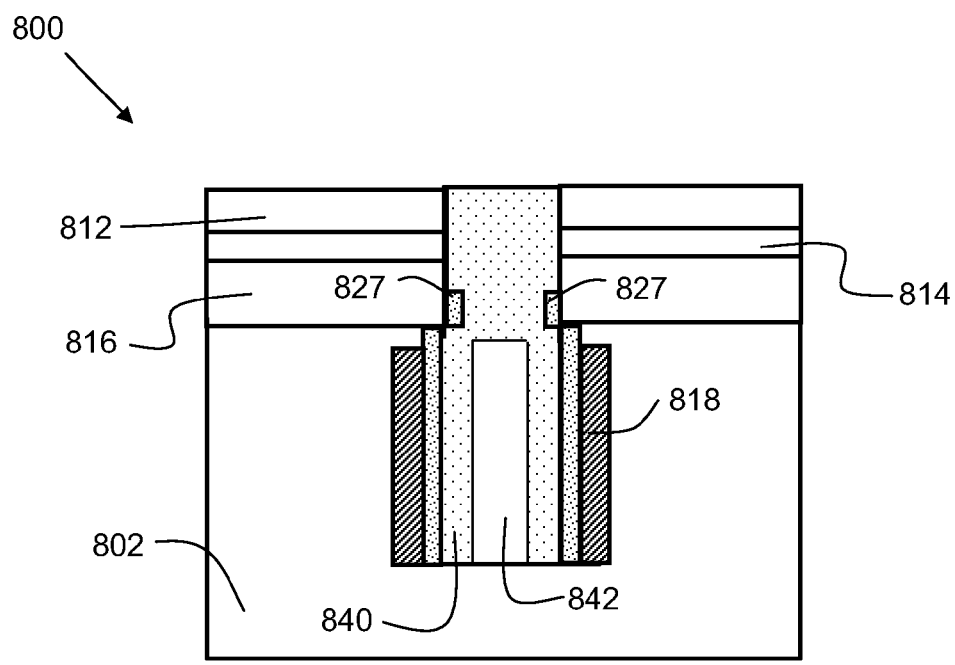

FIG. 8 shows structure 800 after an intermediate step, where the structure is planarized to the SiON layer 812. The HDP layer (see 710 of FIG. 7) is now removed. The planarizing is preferably performed via a chemical mechanical polish (CMP) process.

Figure 9:
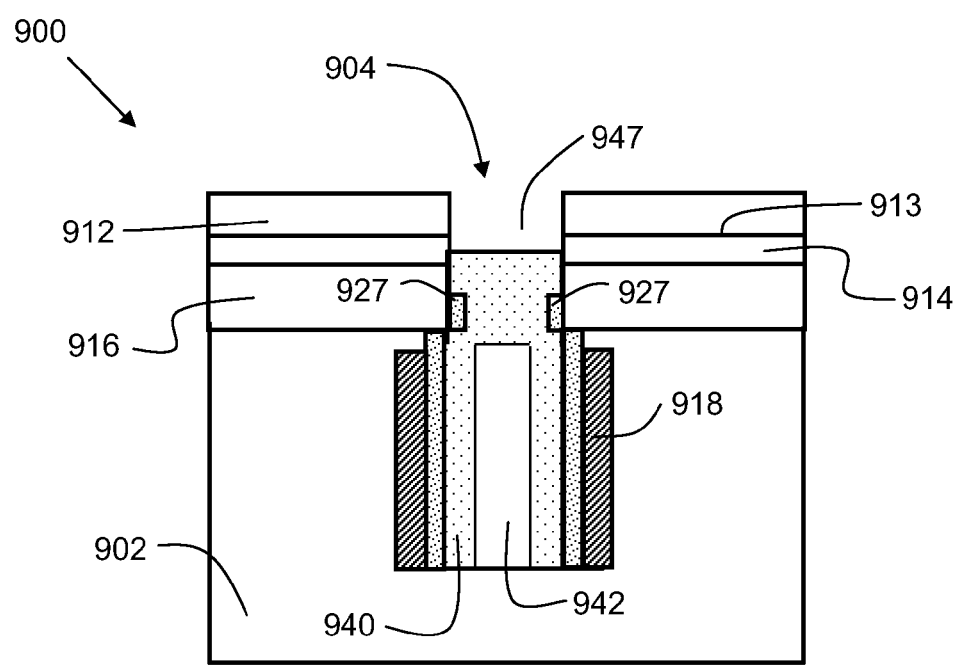

FIG. 9 shows structure 900 after an intermediate step, where the metal 940 is etched, forming cavity 947 at the top of trench 904. This etch may be performed by an RIE process. The metal 940 is preferably etched to slightly below the level of the top 913 of SOI layer 914. In one embodiment, metal 940 is etched to a level about 80 to 160 angstroms below the level of the top of SOI layer 914.

Figure 10:
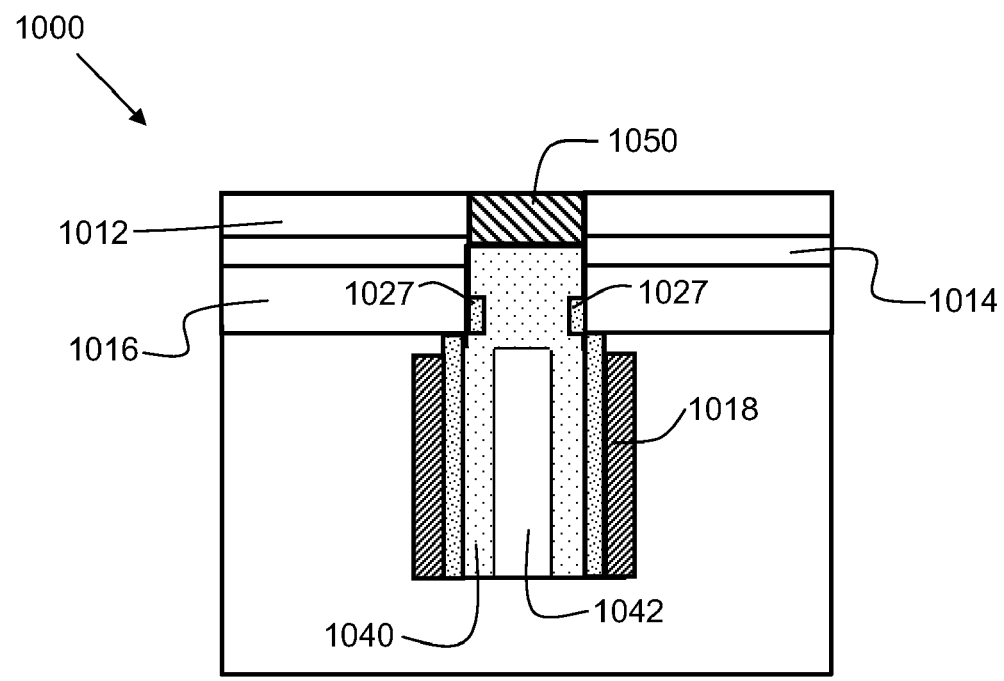

FIG. 10 shows structure 1000 after an intermediate step, where a trench-top oxide 1050 is deposited, and fills cavity 947 (see FIG. 9). A subsequent planarization process may then be performed to make trench-top oxide 1050 at the level of the SiON layer 1012.

FIG. 11 shows structure 1100 after an intermediate step, where an STI cavity 1154 is formed. A resist layer 1152 is first applied using well-known lithographic methods, leaving the structure 1100 exposed in the region of STI cavity 1154, such that an etch is performed on the region of STI cavity 1154, without affecting other parts of structure 1100. The etch process for STI cavity 1154 is preferably a selective etch that does not etch the BOX layer 1116. Hence, the BOX layer 1116 serves as an etch stopping layer, such that STI cavity 1154 traverses the SOI layer 1114.

FIG. 12 shows structure 1200 after an intermediate step, where the STI cavity 1256 is now filled with oxide. A subsequent planarization step removes resist layer 1152 (see FIG. 11) and makes the oxide in the STI cavity 1256 at the level of the top of SiON layer 1212.

FIG. 13 shows structure 1300 after an intermediate step, where the SiON layer (see 1212 of FIG. 12) is removed. This is preferably performed with a selective etch. In one embodiment, the selective etch constituents comprise hot phosphoric acid (H3PO4), which etches nitride selective to oxide.

FIG. 14 shows a structure 1400 in accordance with an embodiment of the present invention. Oxide regions 1450 and 1456 are planarized to the level of the top of SOI layer 1414. Field Effect Transistor (FET) 1462 is formed on structure 1400. Silicide regions 1460A, 1460B and 1460C are formed within SOI layer 1414. This forms a Schottky Barrier Silicided Source and Drain Technology (SSDT) structure. Trench-top oxide layer 1450 covers metal 1440, but is thinner than trench-top oxide layer 1350 (FIG. 13) due to the planarization. Metal 1440 is the top electrode of the trench capacitor 1404. Silicide region 1460B is formed within an active area (source or drain) of FET 1462, and silicide region 1460B is also adjacent to, and in contact with metal 1440. Hence, the silicide region 1460B is now electrically connected to the metal 1440 (top electrode) of the trench capacitor 1404. Trench capacitor 1404 is of the metal-insulator-metal (MIM) type. Hence, structure 1400 comprises a semiconductor circuit that has an electrical connection between a MIM trench capacitor 1404 and FET 1462 without the need for a buried strap, and this embodiment creates a connection with lower resistance, which improves performance and power consumption of the device. Other advantages include superior control of off-state leakage current, elimination of bipolar parasitic action, and fewer process masks and lower thermal budget, for example.

FIG. 15 is a flowchart indicating process steps for an embodiment of the present invention. In process step 1550, a layer stack (see 103 of FIG. 1) is deposited on a silicon substrate. In process step 1552, a trench is formed in the substrate and layer stack (see 104 of FIG. 1). In process step 1554, a first metal, for the bottom electrode of the capacitor is deposited (see 218 of FIG. 2). In process step 1556, a dielectric layer is deposited (see 426 of FIG. 4). In process step 1558, a protective material, such as resist or amorphous carbon is deposited in the trench (see 530A of FIG. 5A). In process step 1560, the dielectric is recessed away from the top of the trench (see FIG. 5B). In process step 1562, a second metal is deposited to form the top electrode of the capacitor (see 740 of FIG. 7). In process step 1564, a planarization is performed to make the top electrode at the same level as the top of the SiON layer (see FIG. 8). In process step 1566, the second metal is recessed to a level slightly below the top of the SOI layer (see FIG. 9), but it is not recessed as far as a level below the bottom of the SOI layer. In process step 1568, a trench-top oxide is deposited on the top electrode (see 1050 of FIG. 10). In process step 1570, an STI trench is formed (see 1154 of FIG. 11). In process step 1572, the structure is planarized to the level of the top of the SiON layer (see FIG. 12). In process step 1574, a transistor is formed adjacent to the trench capacitor, and in step 1576, a silicide region (see 1460B of FIG. 14) is formed, serving as an electrical connector between the transistor and the top electrode of the trench capacitor.

FIG. 16 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-14. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-14. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-14 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-14, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-14. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor circuit comprising: forming a metal-insulator-metal trench capacitor in a silicon substrate; forming a field effect transistor on the silicon substrate adjacent to the metal-insulator-metal trench capacitor; and forming a Schottky Barrier Silicided Source region and a Schottky Barrier Silicided Drain region between the field effect transistor and the metal-insulator-metal trench capacitor wherein one of the Schottky Barrier Silicided Source region and the Schottky Barrier Silicided Drain region is in direct physical contact with the metal-insulator-metal trench capacitor.

2. The method of claim 1, wherein forming a metal-insulator-metal trench capacitor in a silicon substrate comprises:
   forming a layer stack on the silicon substrate;
   forming a trench in the silicon substrate, wherein the trench also traverses the layer stack;
   forming a bottom electrode in the trench;
   depositing a dielectric layer in contact with the bottom electrode;
   forming a top electrode, wherein the dielectric layer is disposed between the bottom electrode and the top electrode.

3. The method of claim 2, wherein forming a layer stack on the silicon substrate comprises:
   depositing a buried oxide layer on the silicon substrate;
   depositing a silicon-on-insulator layer on the buried oxide layer;
   depositing a SiON layer on the silicon-on-insulator layer; and
   depositing a high density plasma oxide layer on the silicon-on-insulator layer.

4. The method of claim 3, wherein depositing a buried oxide layer on the silicon substrate comprises depositing a buried oxide layer having a thickness ranging from about 1050 angstroms to about 1750 angstroms.

5. The method of claim 3, wherein depositing a high density plasma oxide layer comprises depositing a high density plasma oxide layer having a thickness ranging from about 2650 angstroms to about 3350 angstroms.

6. The method of claim 2, wherein forming a bottom electrode in the trench comprises depositing a metal via atomic layer deposition.

7. The method of claim 6, wherein depositing a metal via atomic layer deposition comprises depositing a metal from the group consisting of tungsten, cobalt, and nickel.

8. The method of claim 2, wherein depositing a dielectric layer on the bottom electrode comprises depositing a layer of hafnium oxide.

9. The method of claim 8, wherein depositing a layer of hafnium oxide comprises depositing a layer of silicon doped hafnium oxide.

10. The method of claim 2, wherein forming a top electrode comprises depositing a metal selected from the group consisting of tungsten and titanium.

11. A method of forming a semiconductor circuit comprising:
   depositing a buried oxide layer on a silicon substrate;
   depositing a silicon-on-insulator layer on the buried oxide layer;
   depositing a SiON layer on the silicon-on-insulator layer;
   depositing a high density plasma oxide layer on the SiON layer;
   forming a trench in the silicon substrate;
   depositing a first metal in the trench;
   depositing a dielectric layer within the trench;
   depositing a second metal within the trench;
   planarizing the second metal to the level of the SiON layer;
   removing a portion of the second metal, whereby the second metal is recessed to a level below the top of the silicon-on-insulator layer; and
   forming a silicided Schottky barrier region disposed on the silicon substrate such that it is in direct physical contact with the second metal in the trench.

12. The method of claim 11, further comprising depositing a trench-top oxide on the second metal.

13. The method of claim 12, further comprising forming an STI trench, wherein the STI trench traverses the silicon-on-insulator layer.

14. The method of claim 13, further comprising filling the STI trench with an STI oxide.

15. The method of claim 14, further comprising planarizing the trench-top oxide and the STI oxide to the level of the top of the silicon-on-insulator layer.

16. A semiconductor circuit comprising:
   a silicon substrate;
   a metal-insulator-metal trench capacitor formed in the silicon substrate, the metal-insulator-metal trench capacitor comprising a first electrode, a second electrode, and a dielectric layer disposed in between the first electrode and the second electrode;

a field effect transistor disposed on the silicon substrate adjacent to the metal-insulator-metal trench capacitor; and a silicided Schottky Barrier region disposed on the silicon substrate such that it is in direct physical contact with the metal-insulator-metal trench capacitor to and the field effect transistor.

17. The semiconductor circuit of claim 16, further comprising an oxide layer disposed on the second electrode.

18. The semiconductor circuit of claim 17, wherein the first electrode is comprised of a metal selected from the group consisting of tungsten, cobalt, and nickel.

19. The semiconductor circuit of claim 18, wherein the second electrode is comprised of a metal selected from the group consisting of tungsten and titanium.

20. The semiconductor circuit of claim 18, wherein the dielectric layer is comprised of hafnium oxide.

* * * * *